(12) United States Patent
Boettiger

(10) Patent No.: US 7,879,249 B2
(45) Date of Patent: Feb. 1, 2011

(54) METHODS OF FORMING A LENS MASTER PLATE FOR WAFER LEVEL LENS REPLICATION

(75) Inventor: Ulrich C. Boettiger, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 808 days.

(21) Appl. No.: 11/882,689

(22) Filed: Aug. 3, 2007

(65) Prior Publication Data

US 2009/0032987 A1    Feb. 5, 2009

(51) Int. Cl.
 *B29D 11/00* (2006.01)
(52) U.S. Cl. .................................. 216/24; 430/321
(58) Field of Classification Search .................. None
 See application file for complete search history.

(56) References Cited

U.S. PATENT DOCUMENTS

| | | | |
|---|---|---|---|
| 6,049,430 | A | 4/2000 | Heanue et al. |
| 6,410,213 | B1 | 6/2002 | Raguin et al. |
| 6,632,342 | B1 | 10/2003 | Teshima et al. |
| 6,898,015 | B2 | 5/2005 | Yoshikawa et al. |
| 7,042,645 | B2 | 5/2006 | Houlihan et al. |
| 7,092,165 | B2 | 8/2006 | Morris et al. |
| 7,129,027 | B2 | 10/2006 | Nakajima |
| 2003/0003186 | A1 | 1/2003 | Border et al. |
| 2003/0119962 | A1 | 6/2003 | Border et al. |
| 2003/0127759 | A1 | 7/2003 | Border et al. |
| 2004/0146807 | A1 | 7/2004 | Lee et al. |
| 2004/0264856 | A1 | 12/2004 | Farr |
| 2005/0074702 | A1* | 4/2005 | Lee et al. ................ 430/321 |
| 2005/0152043 | A1 | 7/2005 | Tang |
| 2006/0029890 | A1 | 2/2006 | Ulrich et al. |
| 2006/0046204 | A1 | 3/2006 | Ono et al. |
| 2006/0139758 | A1 | 6/2006 | Segawa et al. |
| 2006/0176583 | A1* | 8/2006 | Jin et al. ................. 359/811 |
| 2006/0177959 | A1 | 8/2006 | Boettiger et al. |
| 2006/0214203 | A1 | 9/2006 | Li et al. |
| 2006/0254318 | A1 | 11/2006 | Dona et al. |
| 2006/0273478 | A1 | 12/2006 | Jin et al. |
| 2007/0029277 | A1* | 2/2007 | Jacobowitz et al. ......... 216/24 |
| 2007/0030570 | A1 | 2/2007 | Jacobowitz et al. |
| 2007/0046862 | A1 | 3/2007 | Umebayashi et al. |
| 2007/0121212 | A1 | 5/2007 | Boettiger et al. |
| 2007/0217019 | A1 | 9/2007 | Huang et al. |
| 2007/0226452 | A1 | 9/2007 | Wu et al. |
| 2007/0263291 | A1 | 11/2007 | Whitehead |
| 2009/0325107 | A1* | 12/2009 | Oliver et al. ............. 430/321 |

FOREIGN PATENT DOCUMENTS

CN       1979884 A       6/2007

(Continued)

OTHER PUBLICATIONS

Wolf et al., Silicon Processing for the VLSI Era, 1986, vol. 1, pp. 407-409, 452-454.*

(Continued)

*Primary Examiner*—Duy-Vu N Deo

(57) ABSTRACT

Methods of forming a lens master plate. In one embodiment, a substrate is coated with a polymer material layer. Isolated sections are formed in the polymer material layer. The isolated sections are formed into lens shapes using a lens master.

10 Claims, 4 Drawing Sheets

FOREIGN PATENT DOCUMENTS

| | | |
|---|---|---|
| JP | 2000-31442 A | 1/2000 |
| JP | 2000-89002 A | 3/2000 |
| JP | 2004-226639 A | 8/2004 |
| JP | 2005-041125 | 2/2005 |
| JP | 2005-227699 A | 8/2005 |
| JP | 2005-258349 A | 9/2005 |
| JP | 2005-321710 A | 11/2005 |
| JP | 2006-126455 | 5/2006 |
| JP | 2006-253464 A | 9/2006 |
| JP | 2006-264001 A | 10/2006 |
| TW | 463217 | 11/2001 |
| WO | WO 01/62400 A2 | 8/2001 |

OTHER PUBLICATIONS

Tsou, C. et al., "A New Method for Microlens Fabrication by a Heating Encapuslated Air Process", Photonics Technology Letters, IEEE, Dec. 1, 2006, vol. 18, Issue 23, pp. 2490-2492, http://ieeexplore.ieee.org/iel5/68/4012076/04014253.pdf?tp=&arnumber=4014253&isnumber=4012076.

Suleski, T. et al., "Fabrication Trends for Free-Space Microoptics", Journal of Lightwave Technology, Feb. 2005, vol. 23, Issue 2, pp. 633-646, http://ieeexplore.ieee.org.ie15/50/30450/01402543.pdf?tp=&isnumber=30450&arnumber=1402543&punumber=50.

Stuck, A. et al., "Mass Producible Integrated Micro-Optic Devices and Systems", Optical MEMS and Their Applications Conferences, 2006, IEEE/LEOS International Conference, Aug. 21-24, 2006, pp. 32-33, http://ieeexplore.org/iel5/11194/36055/01708250.pdf?tp=&isnumber=36055&arnumber=1708250&punumber=11194.

Kim, S. et al., "Replication Qualities and Optical Propeties of UV-Moulded Microlens Arrays", School of Mechanical Engineering, Yonsei University, Seoul, Korea, 2003, http://www.iop.org/EJ/abstract/0022-3727/36/20/005.

Moench, W. et al., "Fabrication and Testing of Micro-Lens Arrays by All-Liquid Techniques", Journal of Optics A: Pure and Applied Optics, 2004, pp. 330-337, http://www.iop.org/EJ/abstract/1464-4258/6/4/007.

R. Völkel, et al., "Miniaturization of Imaging Systems" MST/MEMS For Production Engineering, mstnews Feb. 2003, pp. 36-38.

M. McCormick, et al., "Microengineering Design and Manufacturing Using the LIGA Process" Engineering Science and Education Journal, pp. 255-262, Dec. 1994.

Engineering Science and Education Journal, pp. 255-262, Dec. 1994.

* cited by examiner

US 7,879,249 B2

METHODS OF FORMING A LENS MASTER PLATE FOR WAFER LEVEL LENS REPLICATION

FIELD OF THE INVENTION

Embodiments of the invention relate generally to the field of semi-conductor imaging devices, and more particularly to methods of forming lens masters for wafer level lens replication.

BACKGROUND OF THE INVENTION

Imaging devices, including charge coupled devices (CCD) and complementary metal oxide semiconductor (CMOS) circuits, among others, have commonly been used in photo-imaging applications. A CMOS imager circuit includes a focal plane array of pixels, each one of the pixels including a photosensor, for example, a photogate, photoconductor or a photodiode for accumulating photo-generated charge in the specified portion of the substrate.

Pixels in an imaging device function to collect light relative to a portion of a scene or image being captured by the imaging device. Lenses may be used to enhance the collection of light at various levels of the image capture process by focusing incoming light onto specific light-collecting portions of the device, thereby decreasing the amount of light lost and increasing the fidelity of the captured image. Accordingly, a lens may be positioned above each pixel in a pixel array to focus incoming light on the photo-sensitive portion of the pixel. At a higher hardware level, an imaging device may further include one or more, larger lenses positioned above the entire pixel array.

In manufacturing lenses, the lenses may be created in a process which involves using a "lens master plate." The lens master plate includes a plurality of lens shaped dies, which constitute "positive" lens shapes. A film is deposited over the wafer to create an intermediate "negative" of the lens master plate. The intermediate negative may then be used to create positive lenses for use in imaging devices. The negative may be formed for all lenses of all pixel arrays of an imaging device on a wafer.

One cost effective and efficient way to form a lens master plate having high-precision lens shaped dies is to obtain one or more single lens masters by, for example, precision diamond tuning, and replicating the master's lens shape through a step and repeat "stamp-and-step" method to populate an entire surface of the lens master plate. A common drawback of this method, as exercised in the current art on a contiguous film of polymer, is the effect the stamping of one lens die ("lens") has on its neighbors. The stamping action displaces a certain amount of polymer, which can distort the shape of the neighboring lens. There is a need to minimize the variability in lens shape in lenses across an area of a lens master plate to be populated using the above described technique.

DETAILED DESCRIPTION OF THE INVENTION

In the following detailed description, reference is made to the accompanying drawings which form a part hereof, and which illustrate specific embodiments of the invention. These embodiments are described in sufficient detail to enable those of ordinary skill in the art to make and use them. It is also understood that structural, logical, or procedural changes may be made to the specific embodiments disclosed herein.

Figure 1:
FIG. 1 is a cross-sectional side view showing a substrate.
Figure 2:
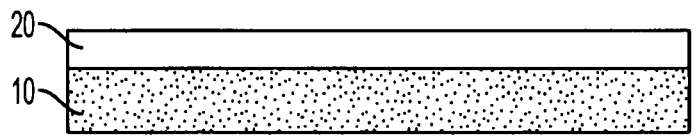
FIG. 2 is a cross-sectional side view showing a substrate coated with a polymer layer.

FIGS. 1-5 illustrate stages of a method for manufacturing a lens master plate in accordance with one embodiment. FIG. 1 shows a support substrate 10, which can be made of any supporting material, for example, metal, glass, polymer, ceramics or other support material. In FIG. 2, the substrate 10 is coated with a suitable lens material 20, for example, a photo-patternable lens polymer. The thickness of the lens material 20 is chosen according to a predetermined amount deemed necessary to provide the correct volume of material for the intended isolation step, described below.

Figure 3:
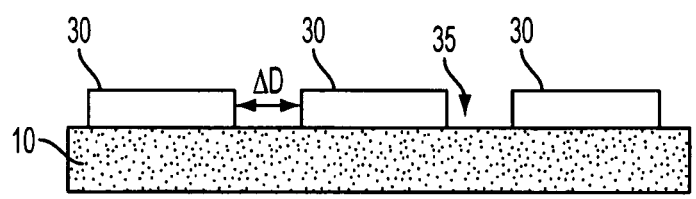
FIG. 3 is a cross-sectional side view showing a plurality of isolated sections formed on a substrate.

As shown in FIG. 3, in the isolation step, the lens material layer 20 is exposed, developed and optionally cured using a mask, common lithographic tools and methods (such tools are well known in the art and will not be described here) to form isolated sections 30. Each section 30 is separated by a gap 35 having a width ΔD. Width ΔD is determined according to the size of the intended lens assembly that is to be created. The size and shape of the isolated sections 30 are selected to provide the correct volume and starting shape for the stamp molding step, which is described next.

Figure 4:
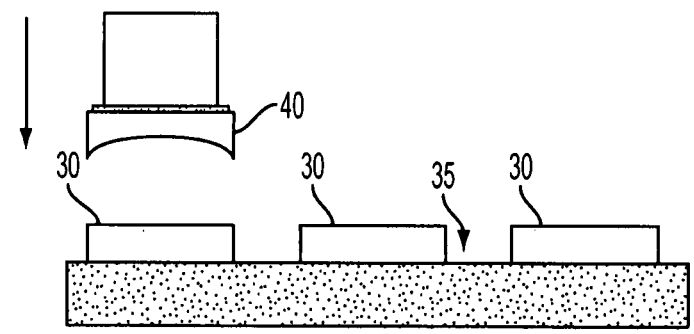
FIG. 4 is a cross-sectional side view showing a lens master for forming lens shapes in a plurality of isolated sections formed on a substrate.
Figure 5:
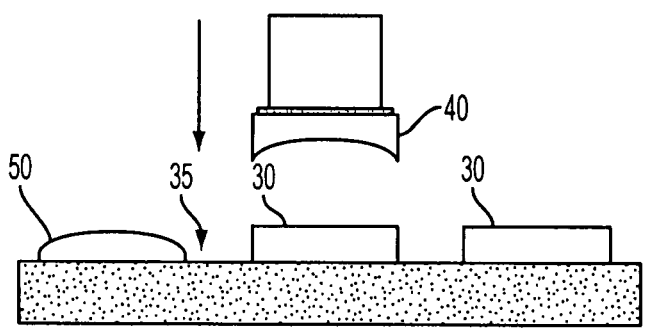
FIG. 5 is a cross-sectional side view showing a lens master executing a "stamp-and-step" operation on a plurality of isolated sections formed on a substrate.

FIG. 4 shows a lens master stamp 40 for stamping a lens shape into the isolated sections 30. The lens master stamp 40 and/or the substrate 10 may be coated with a thin material facilitating the separation of lens and stamp after the stamp molding step. Furthermore, the lens master stamp 40 and/or the substrate 10 may be heated during this stamp molding step. A suitable temperature for the substrate when the lens material of the sections 30 is a lens polymer, for example, would be a temperature that is close to the glass transition temperature of the polymer. During the illustrated stamping molding step, the lens master stamp 40 executes a series "stamp-and-step" operations. First, the lens master stamp 40 is pressed into an isolated section 30 to form the isolated section 30 into a lens shape in accord with the shape of the lens master stamp 40. Next, as shown in FIG. 5, the lens master stamp 40 is removed from the now lens-shaped isolated section, i.e., lens 50, and shifted over to an unformed isolated section 30. The lens master stamp 40 is again pressed into an isolated section 30, and the process is repeated until all isolated sections 30 have been transformed into lenses 50. The lens master stamp 40 may be maintained at a constant temperature or the temperature may be cycled up during the "stamping" step and permitted to cool down during the "stepping" step. The gaps 35 provide an amount of buffer space for displaced material from isolated sections 30, so that the shape of the neighboring lens 50 is not disrupted during the stamping step.

The lens master stamp 40 is illustrated as shifting to a neighboring isolated section 30, however, it may be shifted to any other isolated section 30. Furthermore, a single lens master stamp 40 is shown for illustrative convenience only. Multiple lens masters 40 may be employed, each having the same or differring sizes and each stamping a same or different predetermined pattern of isolated sections.

To avoid the inclusion of air bubbles in the lenses 50, the stamping may be done in a low air pressure environment or in a vacuum. The lenses 50 may be cured individually or collectively by ultraviolet exposure and/or heat treatment during or after the stamping process.

Figure 6:
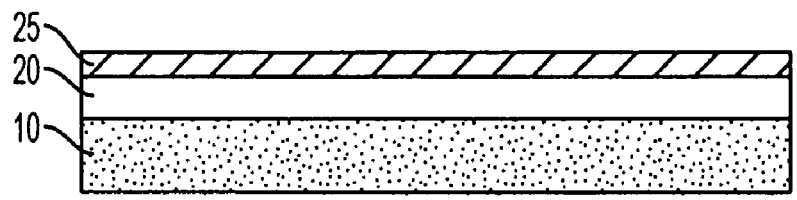
FIG. 6 is a cross-sectional side view showing a substrate coated with a lens material, that is coated with photoresist.

As an alternative to direct lithographic formation of the isolated sections 30 described above, the lens material 20 can be coated with photoresist 25, as shown in FIG. 6. The photoresist 25 is then exposed and developed to provide an etch mask to pattern the underlying lens material 20 by dry or wet etching. The photoresist 25 is removed after the etching, for example by using a wet strip, to leave behind the isolated sections 30 as shown in FIG. 3.

Figure 7:
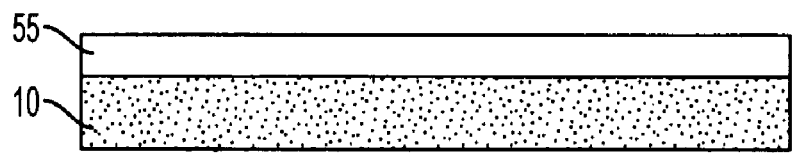
FIG. 7 is a cross-sectional side view showing a substrate coated with a suitable container material.
Figure 8:
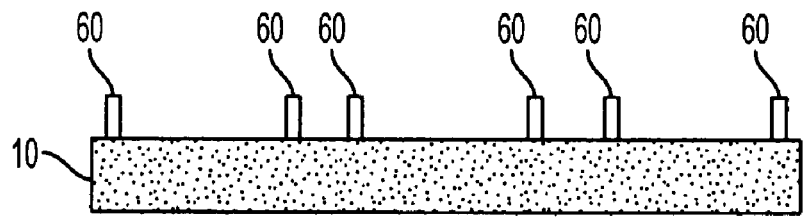
FIG. 8 is a cross-sectional side view showing a plurality of container frames on a substrate.

FIGS. 7-10 show another alternative embodiment of forming isolated sections 30. Referring first to FIG. 7, substrate 10 is coated with a photo-patternable polymer 55, for example, a photoresist. Using known lithographic methods and tools, the photo-patternable polymer 55 is exposed and developed to form a plurality of container frames 60 as shown in FIG. 8. Each container frame 60 is formed in a predetermined size and shape to provide a frame appropriate for holding a required volume of lens material. The container frames 60 can optionally be transferred into the substrate be etching in whole or in part.

Figure 9:
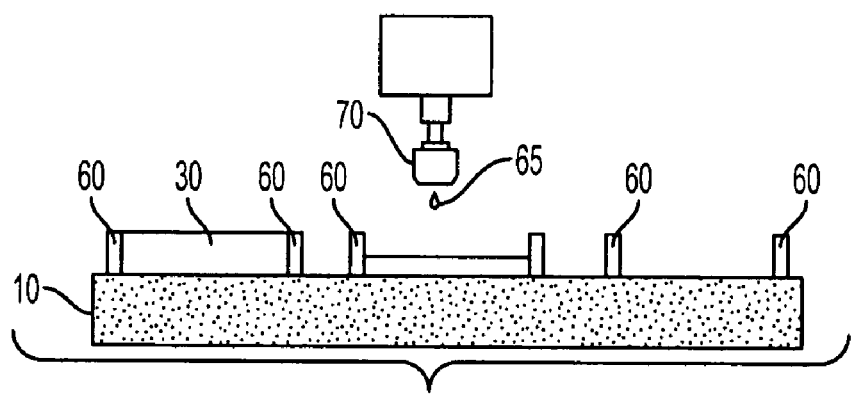
FIG. 9 is a cross-sectional side view showing an ink jet nozzle (or other precision dispenser) depositing liquid lens material within container frames.
Figure 10:
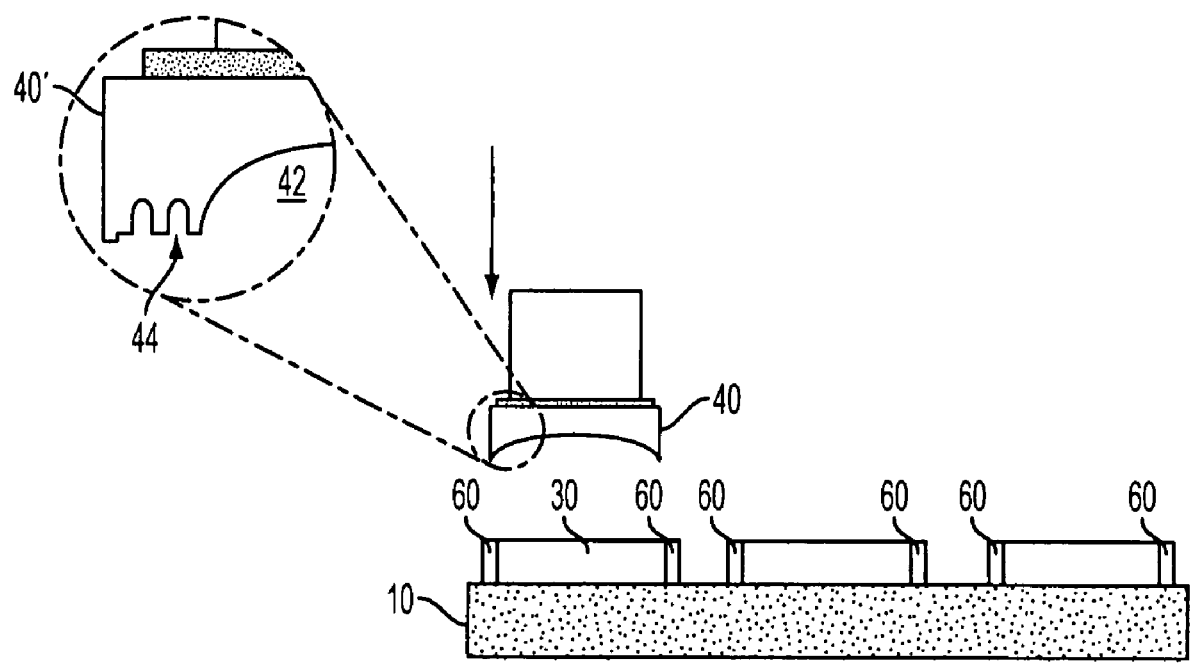
FIG. 10 is a cross-sectional side view showing a lens master for forming lens shapes in isolated sections formed by container frames.

Next, as shown in FIG. 9, a liquid lens material 65 is deposited into the container frames 60. The liquid lens material 65, for example, liquid lens polymer, may be deposited using an ink jet nozzle 70 or some other suitable precision dispensing means. Similar to the "stamp-and-step" method described above, the ink jet nozzle 70 may deposit liquid lens material 65 into a container frame 60 and shift to a next container frame 60 until the required amount of material 65 has been deposited into all container frames 60. The liquid lens material 65 may be permitted to solidify and form isolated sections 30 or it can remain fluid. A lens master stamp 40 may then be used to form a lens shape in the isolated sections 30, as shown in FIG. 10, by the "stamp-and-step" technique described above. The container frames 60 may be removed or dissolved after the liquid lens material solidifies and prior to the stamping process. In an alternative embodiment, shown in the blow-up section in FIG. 10, the lens master stamp 40' may include at least two functional areas: a lens forming area 42, and an excess area 44 comprising grooves or spaces for collecting and shaping any excess material due to volume mismatch. The outermost edge of the lens master stamp 40' provides a seal and excess lens material may be forced into the groves of the excess area 44.

Figure 11:
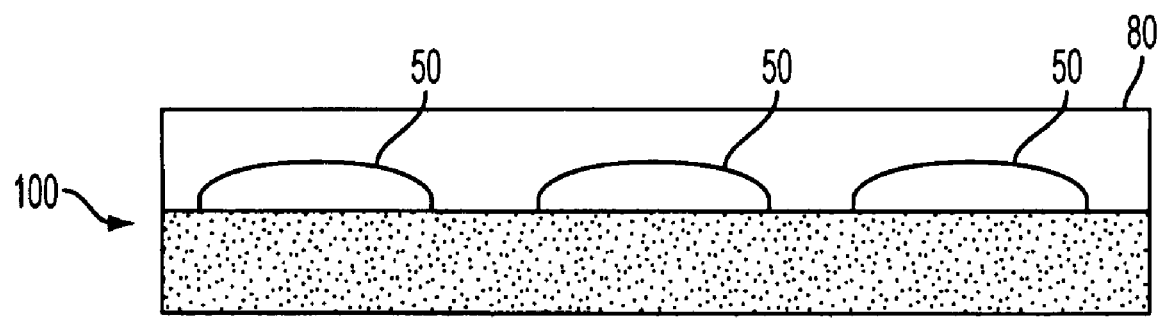
FIG. 11 is a cross-sectional side view showing a plating coating a lens master plate.
Figure 12:
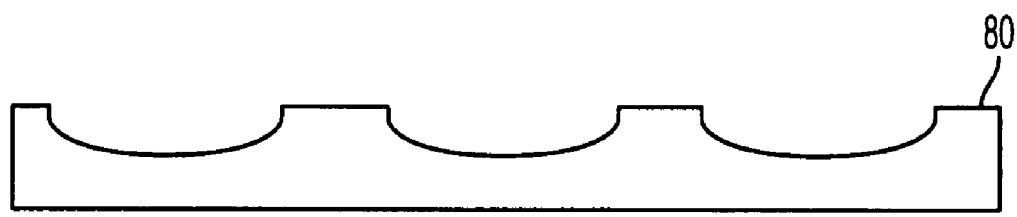
FIG. 12 is a cross-sectional side view showing an intermediate negative for lens replication.

After the lenses 50 (FIG. 5) have been formed in any of the described embodiments, the lenses 50 may be optionally etched into the underlying substrate 10. As shown in FIG. 11, a plating film 80 (e.g., nickel) may be removably deposited over the surfaces of the lenses 50 of the completed lens master plate 100 and used to form an intermediate negative 80 of the lenses 50. The intermediate negative 80 may then be removed (FIG. 12) and used to create lenses for use in an imaging device.

The negatives may be formed in a size sufficient to produce lenses of a pixel array on a single die, or may be larger to produce lenses for a plurality of pixel arrays on respective dies on a wafer. The negatives may also be used to form wafers with lenses corresponding to imager arrays for subsequent assembly by stacking.

While embodiments have been described in detail, it should be readily understood that they are not limited to the disclosed embodiments. Rather the embodiments can be modified to incorporate any number of variations, alterations, substitutions or equivalent arrangements not heretofore described.

What is claimed as new and desired to be protected by Letters Patent of the United States is:

1. A method of forming a plurality of lenses on a substrate comprising:
   forming a photo-patternable polymer on the substrate;
   etching the photo-patternable polymer to form a plurality of container frames;
   depositing lens material into the container frames; and
   using a lens master to stamp a lens shape in the lens material.

2. The method of claim 1, wherein the photo-patternable polymer is photoresist.

3. The method of claim 1, wherein the lens material is liquid polymer.

4. The method of claim 1, further comprising the step of dissolving the container frames after the lens shapes have been stamped.

5. The method of claim 1, further comprising the step of etching the lens shapes into the substrate.

6. The method of claim 1, wherein the lens shapes are each cured individually by ultraviolet light exposure during the stamping process.

7. The method of claim 1, wherein the lens shapes are cured collectively by heat treatment after the stamping process is complete.

8. The method of claim 1, further comprising providing excess areas in the lens master stamp for receiving excess lens material during the stamping process.

9. The method of claim 1, wherein the lens shapes are cured collectively by ultraviolet light exposure after the stamping process is complete.

10. The method of claim 8, further comprising curing the lens shapes collectively by heat treatment.

* * * * *